United States Patent [19]

Bharacharya et al.

[11] Patent Number: 5,476,837

[45] Date of Patent: Dec. 19, 1995

[54] PROCESS FOR PREPARING SUPERCONDUCTING FILM HAVING SUBSTANTIALLY UNIFORM PHASE DEVELOPMENT

[75] Inventors: Raghuthan Bharacharya, Littleton; Philip A. Parilla, Lakewood; Richard D. Blaugher, Evergreen, all of Colo.

[73] Assignee: Midwest Research Institute, Kansas City, Mo.

[21] Appl. No.: 209,312

[22] Filed: Mar. 14, 1994

[51] Int. Cl.$^6$ ............................. C25D 3/56; C25D 5/50
[52] U.S. Cl. .......................... 505/472; 205/51; 205/228; 205/236; 505/510; 505/736
[58] Field of Search .................... 205/51, 227, 228, 205/236; 505/472, 501, 510, 736

[56] References Cited

U.S. PATENT DOCUMENTS

| | | | |
|---|---|---|---|
| 4,105,512 | 8/1978 | Martens et al. | 148/98 |
| 4,127,452 | 11/1978 | Martens et al. | 148/98 |
| 4,879,270 | 11/1989 | Maxfield et al. | 505/410 |
| 4,911,800 | 3/1990 | Sadoway et al. | 205/50 |
| 4,939,119 | 7/1990 | Iwata et al. | 505/401 |
| 5,120,707 | 6/1992 | Maxfield et al. | 505/325 |
| 5,122,506 | 6/1992 | Wang | 505/1 |
| 5,162,295 | 11/1992 | Behi | 505/1 |
| 5,223,478 | 6/1993 | Whitlow et al. | 505/1 |
| 5,306,704 | 4/1994 | Gleixner et al. | 505/425 |

OTHER PUBLICATIONS

Mittag et al., "Magnetic relaxation, flux creep and the distribution of pinning potentials in ceramic Tl–1223 HTSC", *Superconduct. Sci. Technol.*, vol. 4, pp. 244–249, 1991.

Bhattacharya et la., "YBaCuO and TlBaCaCuO Superconductor Thin Films via an Electrodeposition Process", *Journal of the Electrochemical Society*, vol. 139, No. 1, pp. 67–69, Jan. 1992.

Blaugher et al., "The Prospects for Thallium Oxide–Based Wires or Tapes", *Proceedings of the 1992 TCSUH Workshop—HTS Materials, Bulk Processing and Bulk Applications*, C. W. Chu et al., (Ed.), World Scientific, pp. 246–251, 1992.

DeLuca et al., "The preparation of '1223' Tl–Ca–Ba–Cu–oxide superconducting films via the reaction of silver–containing spray deposited Ca–Ba–Cu oxide with thallium oxide vapor", *Physica C*, pp. 21–31, 1993.

*Primary Examiner*—John Niebling
*Assistant Examiner*—William T. Leader
*Attorney, Agent, or Firm*—Edna M. O'Connor

[57] ABSTRACT

A process for preparing a superconducting film, such as a thallium-barium-calcium-copper oxide superconducting film, having substantially uniform phase development. The process comprises providing an electrodeposition bath having one or more soluble salts of one or more respective potentially superconducting metals in respective amounts adequate to yield a superconducting film upon subsequent appropriate treatment. Should all of the metals required for producing a superconducting film not be made available in the bath, such metals can be a part of the ambient during a subsequent annealing process. A soluble silver salt in an amount between about 0.1% and about 4.0% by weight of the provided other salts is also provided to the bath, and the bath is electrically energized to thereby form a plated film. The film is annealed in ambient conditions suitable to cause formation of a superconductor film. Doping with silver reduces the temperature at which the liquid phase appears during the annealing step, initiates a liquid phase throughout the entire volume of deposited material, and influences the nucleation and growth of the deposited material.

12 Claims, 3 Drawing Sheets

PROCESS FOR PREPARING SUPERCONDUCTING FILM HAVING SUBSTANTIALLY UNIFORM PHASE DEVELOPMENT

The United States Government has rights in this invention under Contract No. DE ACO2-83CH10093 between the United States Department of Energy and the National Renewable Energy Laboratory, a division of the Midwest Research Institute.

BACKGROUND OF THE INVENTION

I. Field of the Invention

The present invention relates to an electrodeposition process for preparing a superconducting film having substantially uniform phase development of the constituent metals constituting the film.

II. Description of the Prior Art

It is well recognized that superconducting materials have an infinite potential in technological applications. To achieve a practical utility, however, a superconducting material should be functional at a relatively high temperature, and such high-temperature operability is related to the uniformity of the phase development of the superconductor constituents. For example, in a thallium-barium-calcium-copper oxide (TBCCO) superconductor, a phase development which is a substantially uniform ratio of 1:2:2:3 of thallium to barium to calcium to copper provides a superconductor candidate for operation at about 77° K. with a critical temperature of about 110° K.

While the technique of electrodepositing superconductor constituents on a substrate is known, the usual procedures now employed concentrate only on electrodepositing the metals (e.g. thallium, barium, calcium, copper) whose final composition, upon appropriate subsequent treatment, directly performs as a superconducting material. However, by including in the electroplating process only the metals having superconducting properties, the ability to obtain a substantially uniform phase development of those metals is greatly impaired.

It is therefore apparent that a need is present for a process which substantially standardizes the phase development of the metal constituents formulating an ultimate superconductor material. Accordingly, a primary object of the present invention is to provide an electroplating process for preparing a superconducting film having substantially uniform phase development of the metal constituents which provide superconducting properties.

Another object of the present invention is to provide an electroplating process for preparing a superconducting film wherein the metal constituents thereof are thallium, barium, calcium and copper, substantially in a respective ratio of 2:2:3.

These and other objects of the present invention will become apparent throughout the description of the invention which now follows.

SUMMARY OF THE INVENTION

The present invention is a process for preparing a superconducting film having substantially uniform phase development. The process comprises the sequential steps of, first of all, providing an electrodeposition bath comprising an electrolyte medium and a cathode substrate electrode, and providing to the bath one or more soluble salts of one or more respective potentially superconducting metals in respective amounts adequate to yield a superconducting film upon subsequent appropriate treatment. A soluble silver salt in an amount between about 0.1% and about 4.0% by weight of the provided salts of the potentially superconducting metals is provided to the bath, and the bath is electrically energized to thereby direct ions of each metal to the substrate electrode to form a plated substrate. Thereafter, the plated substrate is annealed in flowing oxygen, oxygen mixed with one or more other gasses, or an oxygen-free gas or mixture of gasses in ambient conditions suitable to cause formation of a superconductor film. Should all of the metals required for producing a superconducting film not be made available in the bath, such metals can be a part of the ambient during the annealing process. Doping with silver reduces the temperature at which the liquid phase appears during the annealing step, initiates a liquid phase throughout the entire volume of deposited material, and influences the nucleation and growth of the deposited material. Consequently, a substantially uniform phase development occurs as the superconductor is formed on the substrate. In one preferred embodiment, thallium nitrate, barium nitrate, calcium nitrate and copper nitrate are provided in the bath for metal plating on a silver foil, and a subsequent thallium-barium-calcium-copper oxide superconductor is produced wherein the respective metals are substantially in a respective ratio of 1:2:2:3. The resultant superconductor is operable at about 77° K., has a relatively high critical temperature of about 110° K., and exhibits intrinsic flux pinning value comparable to a yttrium-barium-copper oxide superconductor composition. In a second preferred embodiment, a thallium source is not introduced in the bath. Instead, a thallium oxide source is provided during the annealing process of the thallium-free film to thereby form a TBCCO film having characteristics substantially identical to those recited above. Superconductor films made in accord with the present invention therefore have excellent transport behavior as well as durability for applications in a wide range of technologies.

DETAILED DESCRIPTION OF THE PREFERRED EMBODIMENT

The preferred embodiment of the present invention is a process for preparing a superconducting film of thallium-barium-calcium-copper oxide (TBCCO) having substantially uniform phase development as a 1:2:2:3 ratio of thallium to barium to calcium to copper. The process is described in the following Examples.

EXAMPLE I

Figure 1:
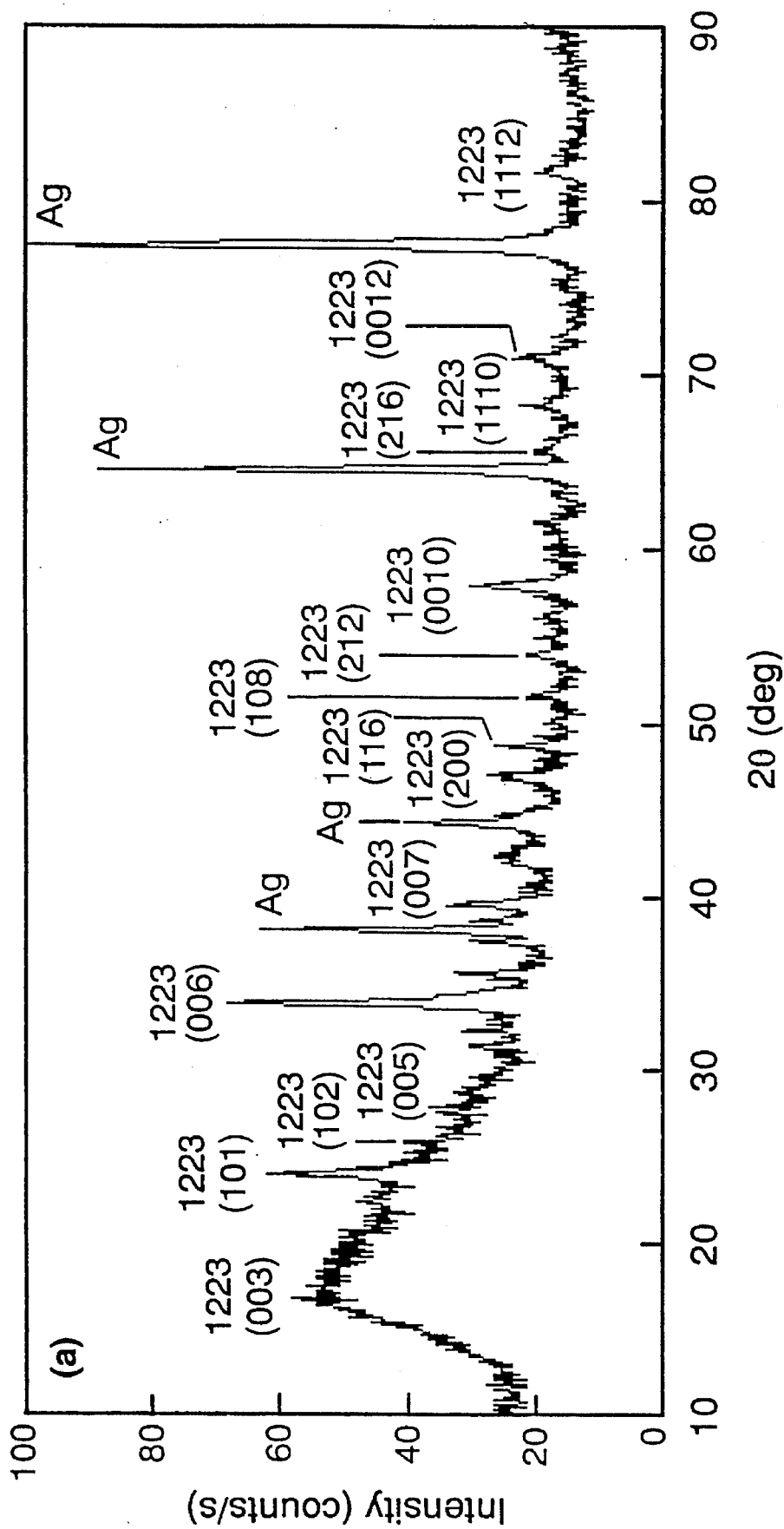
FIG. 1 is a structural x-ray analysis of a first TBCCO film wherein a secondary thallium source is provided during annealing of the film.

An electrodeposition bath containing hydrated metal nitrates dissolved in dimethylsulfoxide (DMSO-an aprotic electrolyte medium), a cathode silver-foil substrate working electrode, a platinum gauze counter electrode and a silver pseudoelectrode was prepared. To prepare the DMSO-nitrates solution initially, 0.013M thallium nitrate, 0.039M barium nitrate, 0.075M calcium nitrate, 0.025M copper nitrate and 0.004M silver nitrate were added to the DMSO. The bath was energized for a period of time of from about five minutes to about 60 minutes via a series of pulsed-potential cycles each comprising 10 seconds at −4 V followed for another 10 seconds at −1 V (vs. Ag), resulting in a deposition rate of about 0.15 μm per minute. The resulting electroplated silver-foil substrate having a TBCCO film thereon was annealed in a furnace for about 15 minutes at 835°–850° C. under flowing oxygen (1SCFH) in the presence of a thallium partial pressure via a TBCCO pellet (2223 phase) which functions as a thallium source to thereby replace any thallium lost from the film during the annealing process. It is to be noted that the oxygen can be replaced with oxygen mixed with one or more other gasses (e.g. argon), or with an oxygen-free gas or gas mixture. After annealing, the furnace was turned off, and cooling occurred at a rate of about 3° C. per minute. The TBCCO film so prepared exhibited primarily a 1223 phase development as shown in FIG. 1, and a $T_c$ onset at about 110° K. with zero resistivity at about 106° K. At 77° K. and no magnetic field, the critical current density was on the order of $10^4$ A/cm$^2$ using the field criterion of 1 μV/cm.

While a pulsed-potential was applied in the above example, it is to be understood that a constant potential of from about −2.5 V to about −4 V for from about five minutes to about 60 minutes can be employed.

EXAMPLE II

Figure 2:
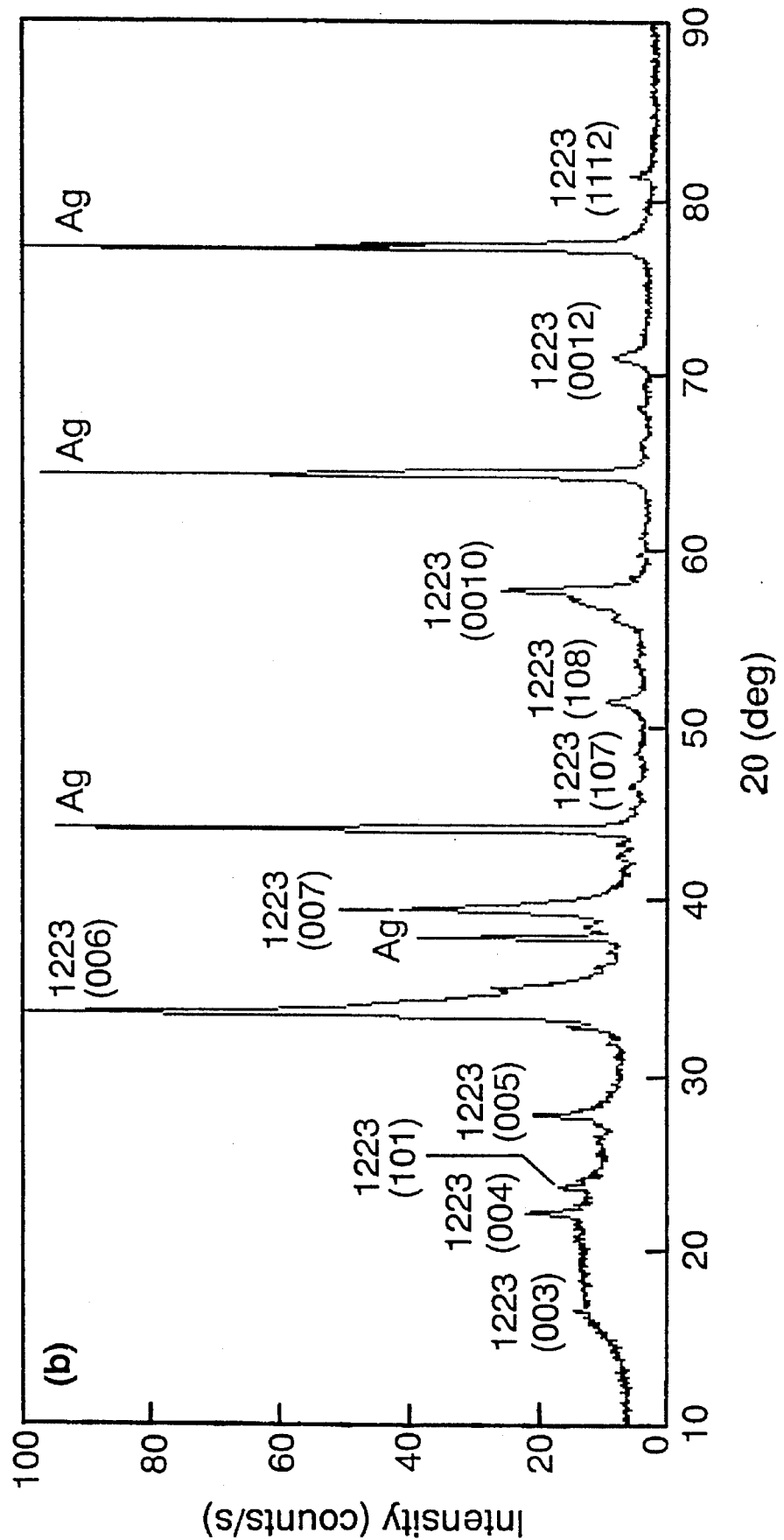
FIG. 2 is a structural x-ray analysis of a second TBCCO film wherein the thallium source is provided in excess during electroplating and is not additionally provided during annealing of the film.

In the same manner as in Example I, an electrodeposition bath is prepared with the nitrates of thallium, barium, calcium, copper and silver, except that an excess of thallium nitrate was introduced. Thus, the bath contained 0.0189M thallium nitrate, 0.039M barium nitrate, 0.075M calcium nitrate, 0.025M copper nitrate and 0.004M silver nitrate. As in Example I, the bath was energized for a period of time of from about five minutes to about 60 minutes via a series of pulsed-potential cycles each comprising 10 seconds at −4 V followed for another 10 seconds at −1 V (vs. Ag), resulting in a deposition rate of about 0.15 μm per minute. The resulting electroplated silver-foil substrate having a TBCCO film thereon was annealed in a furnace for about 5 minutes at 835°–880° C. under flowing oxygen (1SCFH), after which time the furnace was turned off and cooling occurred at a rate of about 3° C. per minute. As in Example I, the oxygen can be replaced with oxygen mixed with one or more other gasses (e.g. argon), or with an oxygen-free gas or gas mixture. Because an excess of thallium nitrate was provided initially, no additional thallium-source pellet was included during the annealing process. The TBCCO film so prepared exhibited primarily a 1223 phase development as shown in FIG. 2, and a $T_c$ onset at about 114° K. with zero resistivity at about 100° K. At 77° K. and no magnetic field, the critical current density was on the order of $10^4$ A/cm$^2$ using the field criterion of 1 μV/cm.

EXAMPLE III

Figure 3:
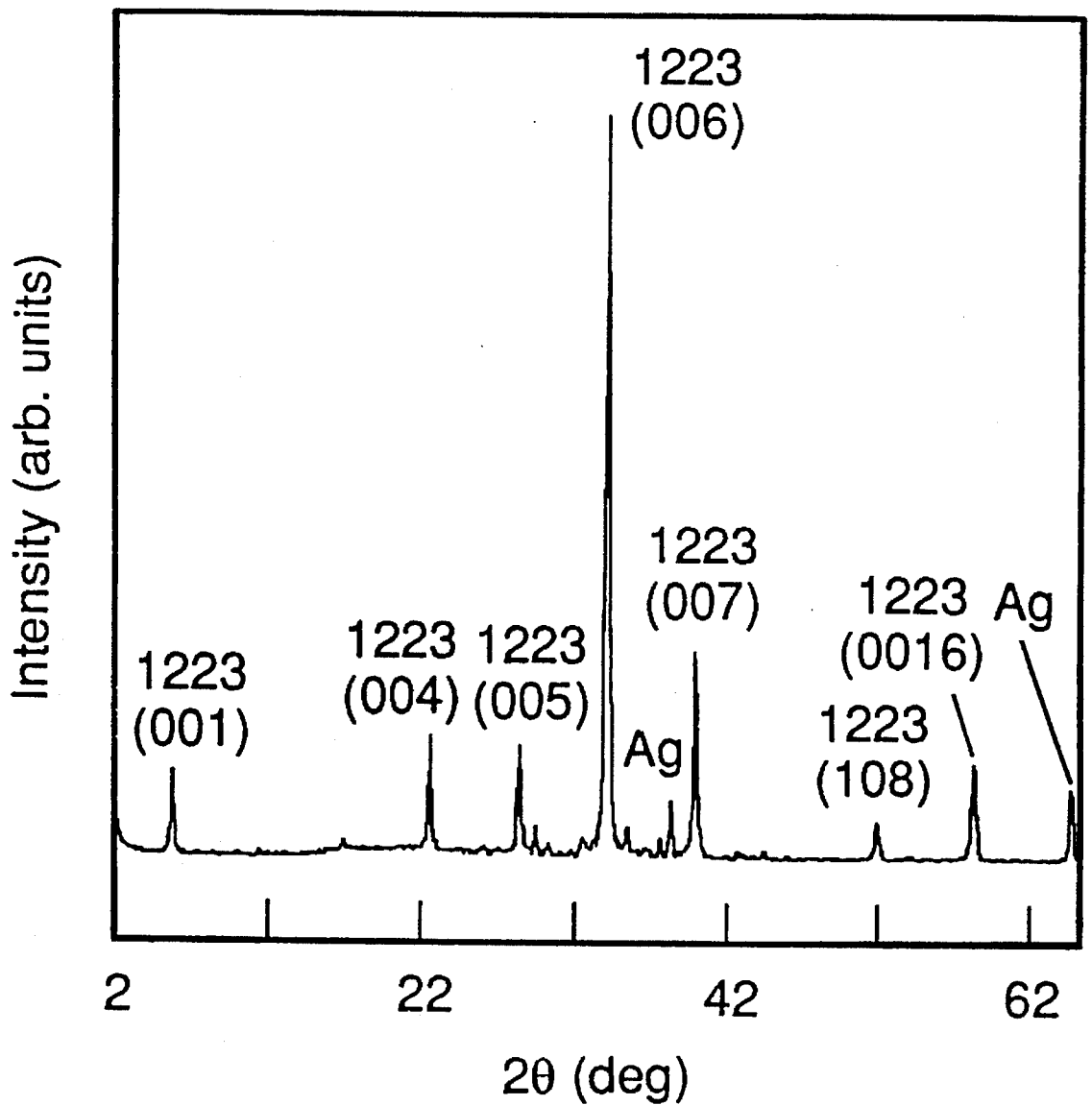
FIG. 3 is a structural x-ray analysis of a third TBCCO film wherein a thallium source is provided only during annealing of the film.

In the same manner as in Example I, except without thallium nitrate, an electrodeposition bath is prepared with the nitrates of barium, calcium, copper and silver. Two platinum gauze counter electrodes were employed so that a properly stoichiometric film is deposited on both sides of the silver-foil substrate electrode. Concentrations of the nitrates were 0.076M barium nitrate, 0.039M calcium nitrate, 0.025M copper nitrate, and 0.003M silver nitrate. Film deposition was performed in a controlled-atmosphere cell (i.e. purged with nitrogen) and with minimal stirring to thereby assure that the process occurred in the diffusion-limited regime. Pulsed-potential electrolysis was employed for a period of time of from about five minutes to about 60 minutes using sequential 10 second waits at −4 V and at −1.5 V vs.Ag. The resulting coated-substrate sample was then processed using a two-zone anneal which employs a separate thallium source-zone and a sample zone within an oxygen ambient or a mixture of oxygen with one or more other gasses (e.g. argon) or an oxygen-free gas or gas mixture. During the anneal, it appears to be necessary to generate a liquid phase to achieve proper morphology for good transport properties, and the silver doping greatly aids in this process. The temperature profile for the anneal consisted of a two-step process for the thallium oxide vapor source from the thallium source-zone (~10 minutes at ~690° C. followed by ~30 minutes at ~730° C.) while simultaneously exposing the sample to 835°–880° C. for about 40 minutes. The resultant TBCCO films were 2–5 μm thick. X-ray diffraction data, as shown in FIG. 3, indicated a nearly phase-pure c-axis textured TBCCO film. The film had a $T_c$ onset at about 110° K. with zero resistivity at about 102° K. At 77° K. and no magnetic field, the critical current density was on the order of $10^4$ A/cm$^2$ using the field criterion of 1 μV/cm.

As is apparent, the present inventive process provides efficient, effective and time-sensitive methodology for the preparation of superconducting films having a high level of reliability, reproducibility and uniformity. The films so produced have excellent transport properties and therefore are candidates for general as well as specific applications requiring superconductivity.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

We claim:

1. A process for preparing a superconducting film having substantially uniform phase development, the process comprising:

a) providing an electrodeposition bath comprising an electrolyte medium and a cathode substrate electrode;

b) providing to the bath soluble slats of thallium, barium, calcium and copper in respective amounts adequate to yield a superconducting film upon subsequent appropriate treatment;

c) providing to the bath a soluble silver salt in an amount between about 0.1% and about 4.0% by weight of the total weight of the thallium, barium, calcium and copper salts;

d) electrically energizing the bath to thereby direct ions of thallium, barium, calcium, copper and silver in the bath to the substrate electrode to electroplate thallium, barium, calcium, copper and silver on the substrate and thereby form a single layer of film; and e) annealing the film in flowing oxygen, oxygen mixed with one or more other gasses, or an oxygen-free gas or mixture of gasses in ambient conditions suitable to cause formation of a thallium-barium-calcium-copper oxide superconductor film.

2. A process as claimed in claim 1 wherein the salts of thallium, barium, calcium, copper and silver in the bath are nitrates.

3. A process as claimed in claim 2 wherein the substrate is selected from the group consisting of silver foil and silver-coated magnesium oxide.

4. A process for preparing a superconducting film of thallium-barium-calcium-copper oxide having substantially uniform phase development as a 1:2:2:3 ratio of thallium to barium to calcium to copper, the process comprising:
   a) providing an electrodeposition bath comprising an electrolyte medium and a cathode substrate electrode;
   b) providing to the bath thallium nitrate, barium nitrate, calcium nitrate and copper nitrate in respective amounts adequate to yield said superconducting film upon subsequent appropriate treatment;
   c) providing to the bath silver nitrate in an amount between about 0.1% and about 4.0% by weight of the total weight of the thallium nitrate, barium nitrate, calcium nitrate and copper nitrate;
   d) electrically energizing the bath to thereby direct thallium, barium, calcium, copper and silver ions in the bath to the substrate electrode to electroplate the thallium, barium, calcium, copper and silver metals on the substrate to thereby form a single layer of film; and
   e) annealing the film in flowing oxygen, oxygen mixed with one or more other gasses, or an oxygen-free gas or mixture of gasses in ambient conditions suitable to cause formation of a thallium-barium-calcium-copper oxide superconductor film.

5. A process as claimed in claim 4 wherein the molar ratios of thallium nitrate to barium nitrate to calcium nitrate to copper nitrate to silver nitrate are about 18.9:39:75:25:4.

6. A process as claimed in claim 4 wherein the substrate is selected from the group consisting of silver foil and silver-coated magnesium oxide.

7. A process for preparing a superconducting film of thallium-barium-calcium-copper oxide having substantially uniform phase development as a 1:2:2:3 ratio of thallium to barium to calcium to copper, the process comprising:
   a) providing an electrodeposition bath comprising an electrolyte medium and a cathode substrate electrode;
   b) providing to the bath thallium nitrate, barium nitrate, calcium nitrate and copper nitrate in respective amounts adequate to yield said superconducting film upon subsequent appropriate treatment;
   c) providing to the bath silver nitrate in an amount between about 0.1% and about 4.0% by weight of the total weight of the thallium nitrate, barium nitrate, calcium nitrate and copper nitrate;
   d) electrically energizing the bath to thereby direct thallium, barium, calcium, copper and silver ions in the bath to the substrate electrode to electroplate the thallium, barium, calcium, copper and silver metals on the substrate to thereby form a single layer of film; and
   e) annealing the film in flowing oxygen, oxygen mixed with one or more other gasses, or an oxygen-free gas or mixture of gasses at a temperature of from about 835° C. to about 880° C. in the presence of a thallium source which replaces any thallium lost during annealing for a period of time sufficient to produce a thallium-barium-calcium-copper oxide superconducting film.

8. A process as claimed in claim 7 wherein the molar ratios of thallium nitrate to barium nitrate to calcium nitrate to copper nitrate to silver nitrate are about 13:39:75:25:4.

9. A process as claimed in claim 7 wherein the substrate is selected from the group consisting of silver foil and silver-coated magnesium oxide.

10. A process for preparing a superconducting film of thallium-barium-calcium-copper oxide having substantially uniform phase development as a 1:2:2:3 ratio of thallium to barium to calcium to copper, the process comprising:
    a) providing an electrodeposition bath comprising an electrolyte medium and a cathode substrate electrode;
    b) providing to the bath barium nitrate, calcium nitrate and copper nitrate in respective amounts adequate to yield said superconducting film upon subsequent appropriate treatment;
    c) providing to the bath silver nitrate in an amount between about 0.1% and about 4.0% by weight of the total weight of the barium nitrate, calcium nitrate and copper nitrate;
    d) electrically energizing the bath to thereby direct thallium, barium, calcium, copper and silver ions in the bath to the substrate electrode to electroplate the barium, calcium, copper and silver metals on the substrate to thereby form a single layer of film; and
    e) subjecting the film to an annealing process in flowing oxygen, oxygen mixed with one or more other gasses, or an oxygen-free gas or mixture of gasses in the presence of a thallium source which supplies all required thallium to the film for a period of time sufficient to produce a thallium-barium-calcium-copper oxide superconducting film.

11. A process as claimed in claim 10 wherein the annealing process is a two-step process comprising a period of about 10 minutes at about 690° C. followed by a period of about 30 minutes at about 730° C. while simultaneously exposing the film for a period of about 40 minutes to a temperature of about 860° C.

12. A process as claimed in claim 11 wherein the molar ratios of barium nitrate to calcium nitrate to copper nitrate to silver nitrate are about 76:39:25:3.

* * * * *